United States Patent
Leobandung et al.

(10) Patent No.: US 10,804,107 B2
(45) Date of Patent: *Oct. 13, 2020

(54) WELL AND PUNCH THROUGH STOPPER FORMATION USING CONFORMAL DOPING

(71) Applicant: ELPIS TECHNOLOGIES INC., Ottawa (CA)

(72) Inventors: Effendi Leobandung, Stormville, NY (US); Tenko Yamashita, Schenectady, NY (US)

(73) Assignee: ELPIS TECHNOLOGIES INC. (CA)

(*) Notice: Subject to any disclaimer, the term of this patent is extended or adjusted under 35 U.S.C. 154(b) by 0 days.

This patent is subject to a terminal disclaimer.

(21) Appl. No.: 16/671,218

(22) Filed: Nov. 1, 2019

(65) Prior Publication Data

US 2020/0066531 A1 Feb. 27, 2020

Related U.S. Application Data

(63) Continuation of application No. 15/934,006, filed on Mar. 23, 2018, now Pat. No. 10,607,838, and a
(Continued)

(51) Int. Cl.
*H01L 21/225* (2006.01)
*H01L 21/8238* (2006.01)
(Continued)

(52) U.S. Cl.
CPC ...... *H01L 21/2257* (2013.01); *H01L 21/2256* (2013.01); *H01L 21/823807* (2013.01);
(Continued)

(58) Field of Classification Search
CPC ......... H01L 21/823821; H01L 21/2257; H01L 21/2255; H01L 21/2256; H01L 27/0924;
(Continued)

(56) References Cited

U.S. PATENT DOCUMENTS 5,698,461 A 12/1997 Liu
7,524,743 B2 4/2009 Gupta et al.
(Continued)

FOREIGN PATENT DOCUMENTS

JP 10-270569 10/1998
WO 2015/047253 A1 4/2015

OTHER PUBLICATIONS

Office action issued in U.S. Appl. No. 15/332,656 dated Nov. 30, 2018 pp. 1-8.
(Continued)

*Primary Examiner* — Michael M Trinh
(74) *Attorney, Agent, or Firm* — Tutunjian & Bitetto, P.C.

(57) ABSTRACT

A method for doping fins includes, for a first dopant layer formed in a first region and a second region to a height continuously below a top portion of a plurality of fins such that an entirety of the first dopant layer is formed below the top portion of the plurality of fins, and a dielectric layer formed over the top portion of the plurality of fins, removing the dielectric layer and the first dopant layer in the first region to expose a first fin in the first region, forming a second dopant layer over the first fin, and annealing to drive dopants into the fins from the first dopant layer in the second region and from the second dopant layer in the first region.

20 Claims, 5 Drawing Sheets

Related U.S. Application Data continuation of application No. 15/354,637, filed on Nov. 17, 2016, now Pat. No. 9,984,880, which is a continuation of application No. 15/059,516, filed on Mar. 3, 2016, now Pat. No. 9,881,919.

(51) Int. Cl.
  *H01L 27/092* (2006.01)
  *H01L 29/66* (2006.01)
  *H01L 29/10* (2006.01)
  *H01L 29/16* (2006.01)

(52) U.S. Cl.
  CPC .......... *H01L 21/823821* (2013.01); *H01L 21/823892* (2013.01); *H01L 27/0921* (2013.01); *H01L 27/0924* (2013.01); *H01L 29/1083* (2013.01); *H01L 29/16* (2013.01); *H01L 29/66803* (2013.01); *H01L 21/2255* (2013.01)

(58) Field of Classification Search
  CPC .......... H01L 21/2224; H01L 29/66803; H01L 21/823807; H01L 21/823892
  See application file for complete search history.

(56) References Cited

U.S. PATENT DOCUMENTS

| | | | |
|---|---|---|---|
| 8,114,761 B2 | 2/2012 | Mandrekar et al. | |
| 8,546,880 B2 | 10/2013 | Lee et al. | |
| 8,932,918 B2 | 1/2015 | Cheng et al. | |
| 8,956,983 B2 | 2/2015 | Swaminathan et al. | |
| 9,059,080 B2 | 6/2015 | Anderson et al. | |
| 9,178,067 B1* | 11/2015 | Ching | H01L 29/0607 |
| 9,514,995 B1 | 12/2016 | Fogel et al. | |
| 9,881,919 B2* | 1/2018 | Leobandung | H01L 29/66803 |
| 9,984,880 B2* | 5/2018 | Leobandung | H01L 21/823821 |
| 2009/0278196 A1 | 11/2009 | Chang et al. | |
| 2010/0144121 A1 | 6/2010 | Chang et al. | |
| 2010/0163971 A1 | 7/2010 | Hung et al. | |
| 2013/0280883 A1* | 10/2013 | Faul | H01L 21/2255 438/434 |
| 2014/0117462 A1* | 5/2014 | Cheng | H01L 29/66803 257/410 |
| 2015/0054033 A1 | 2/2015 | Cheng et al. | |
| 2015/0262861 A1 | 9/2015 | Hung et al. | |
| 2015/0270373 A1* | 9/2015 | Horak | H01L 29/66545 257/401 |
| 2016/0056156 A1* | 2/2016 | Ghani | H01L 21/823821 257/401 |
| 2016/0163829 A1 | 6/2016 | Ku et al. | |
| 2017/0069549 A1* | 3/2017 | Basker | H01L 21/823878 |

OTHER PUBLICATIONS

List of IBM Patents or Patent Applications Treated as Related dated Nov. 1, 2019, 2 pages.

* cited by examiner

WELL AND PUNCH THROUGH STOPPER FORMATION USING CONFORMAL DOPING

BACKGROUND

The present invention relates to semiconductor processing, and more particularly to fin field effect transistor (finFET) devices and methods for formation that include doping of punch through stoppers and wells using conformal doping.

Solid phase doping processes for doping fins is very complex. Typical processing for complementary metal oxide semiconductor (CMOS) fins involves deposition and patterning of a double layer nitride on n-type field effect transistors (NFETs) and a single layer nitride formed on p-type field effect transistors (PFETs). Different layers are processed at the bottom of fins for etching shallow trench isolation regions (STI) adjacent to PFET fins, etc. The processing involves a number of processes that switch back and forth between NFET and PFET regions—blocking one region to process the other. Such processing adds complexity and cost to the fin doping process.

SUMMARY

A method for doping fins includes depositing a first dopant layer at a base of fins formed in a substrate, depositing a dielectric layer on the first dopant layer and etching the dielectric layer and the first dopant layer in a first region to expose the substrate and the fins. A second dopant layer is conformally deposited over the fins and the substrate in the first region. The second dopant layer is recessed to a height on the fins in the first region. An anneal is performed to drive dopants into the fins from the first dopant layer in a second region and from the second dopant layer in the first region to concurrently form punch through stoppers in the fins and wells in the substrate.

A method for doping fins includes etching fins in a substrate; depositing a first dopant layer at a base of the fins; depositing a dielectric layer on the first dopant layer; etching the dielectric layer and the first dopant layer in a first region to expose the substrate and the fins; conformally depositing a second dopant layer over the fins and the substrate in the first region; conformally forming a cap layer over the second dopant layer; forming and recessing an organic dielectric layer down to a height on the fins in the first region; recessing the cap layer and second dopant layer to the height; and annealing to drive dopants into the fins from the first dopant layer in a second region and from the second dopant layer in the first region to concurrently form punch through stoppers in the fins and wells in the substrate.

A method for doping fins includes, for a first dopant layer formed in a first region and a second region to a height continuously below a top portion of a plurality of fins such that an entirety of the first dopant layer is formed below the top portion of the plurality of fins, and a dielectric layer formed over the top portion of the plurality of fins, removing the dielectric layer and the first dopant layer in the first region to expose a first fin in the first region, forming a second dopant layer over the first fin, and annealing to drive dopants into the fins from the first dopant layer in the second region and from the second dopant layer in the first region.

A fin field effect transistor device includes a first dopant layer formed at a base of fins and on a substrate supporting the fins in a first region and a cap layer formed on first dopant layer. The first dopant layer and the cap layer are disposed below a punch through stopper height on the fins. A second dopant layer is formed at a base of fins and on the substrate supporting the fins in a second region. The second dopant layer is disposed below a punch through stopper height on the fins. A first well is formed in the substrate in the first region below the first dopant layer. A second well is formed in the substrate in the second region below the second dopant layer. A field dielectric is formed from the base of the fins to a top of punch through stoppers in the first and second regions.

These and other features and advantages will become apparent from the following detailed description of illustrative embodiments thereof, which is to be read in connection with the accompanying drawings.

BRIEF DESCRIPTION OF THE DRAWINGS

The disclosure will provide details in the following description of preferred embodiments with reference to the following figures wherein.

DETAILED DESCRIPTION

Figure 1:
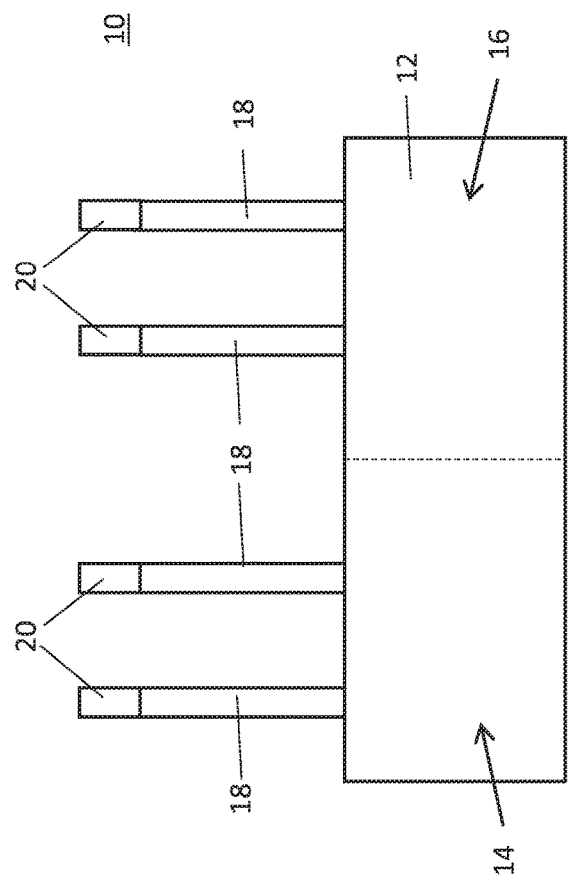
FIG. 1 is a cross-sectional view of a fin field effect transistor (finFET) device showing formation of fins from a substrate, which supports fins in two regions (e.g., NFET and PFET regions) in accordance with the present principles.

In accordance with the present principles, methods and devices are described that employ conformally deposited dopant sources. The dopant sources concurrently provide dopants for the formation of punch through stoppers (PTSs) and well formation in a fin and a substrate below the fin. The different conformally deposited dopant sources can be formed in different regions of a substrate or chip. For example, in one embodiment, different conformally deposited dopant sources may be employed to concurrently dope n-type field effect transistor (NFET) regions and p-type field effect transistor (PFET) regions.

After placement of the conformally deposited dopant sources an anneal process may be performed to concurrently form the PTSs and base well for the fins. In a particularly useful embodiment, a single anneal process may be performed to concurrently form the PTSs and base wells for the fins in different regions (e.g., an NFET region and a PFET region). Dopants are driven into the surrounding materials by the anneal process to form the PTSs and wells.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a partially fabricated semiconductor device 10 is illustratively shown. The device 10 includes a bulk substrate 12. The substrate 12 includes a semiconductor material, such as, e.g., Si, SiGe, Ge, III-V materials, or any other suitable substrate material. The substrate 12 may be divided into regions where different processing may be carried in each. In one embodiment, a region 14 may be provided for NFETs and a region 16 may be provided for PFETs in a CMOS device.

A hard mask 20 is formed over the substrate 12. The hard mask 20 may include a nitride although resist materials or other dielectric materials may also be employed. The hard mask 20 may be patterned using lithography or a layer of resist may be formed on the hard mask 20 and patterned with lithography. Other patterning processes may also be employed, e.g., spacer image transfer (SIT), etc. An etch process is employed to pattern the hard mask 20 and that pattern (e.g., resist) and/or the hard mask 20 itself may be employed to etch fins 18 in the substrate 12. The etch process for forming the fins 18 may include, e.g., a reactive ion etch (RIE) process. The fins 18 are formed in regions 14 and 16. In a particularly useful embodiments, the substrate 12 and fins 18 include crystalline Si.

Figure 2:
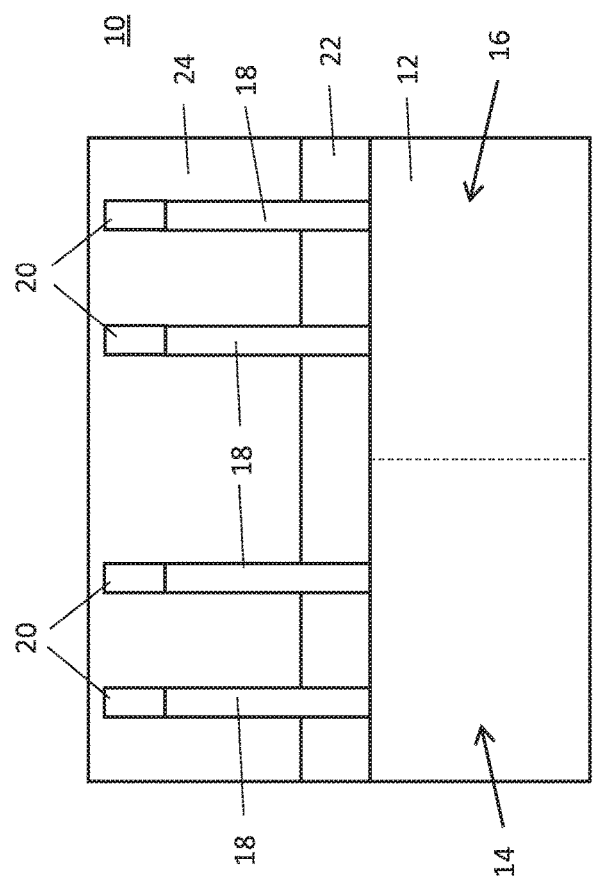
FIG. 2 is a cross-sectional view of the device of FIG. 1 showing a deposition of a first dopant layer and a dielectric layer on the first dopant layer in accordance with the present principles.

Referring to FIG. 2, a first dopant layer 22 is deposited over the hard mask 20 and substrate 12. The first dopant layer 22 is recessed to a position below a height of the fins 18. The height of the first dopant layer 22 is determined based upon a position for a formation of a punch through stopper (PTS). The first dopant layer 22 may include a dopant carrying silicate glass, such as, e.g., phosphosilicate glass (PSG). PSG provides phosphorus dopants (n-type) for PFET regions 16; however, other silicate glasses or dopant carrying materials may be employed for n-doping. The first dopant layer 22 may be deposited using a chemical vapor deposition (CVD) process although evaporative and other deposition processes may be employed.

After recessing the first dopant layer 22, a dielectric layer 24 is deposited over the fins 18 and the first dopant layer 22. The dielectric layer 24 may include, e.g., oxide, such as $SiO_2$, although other dielectric materials may be employed.

Figure 3:
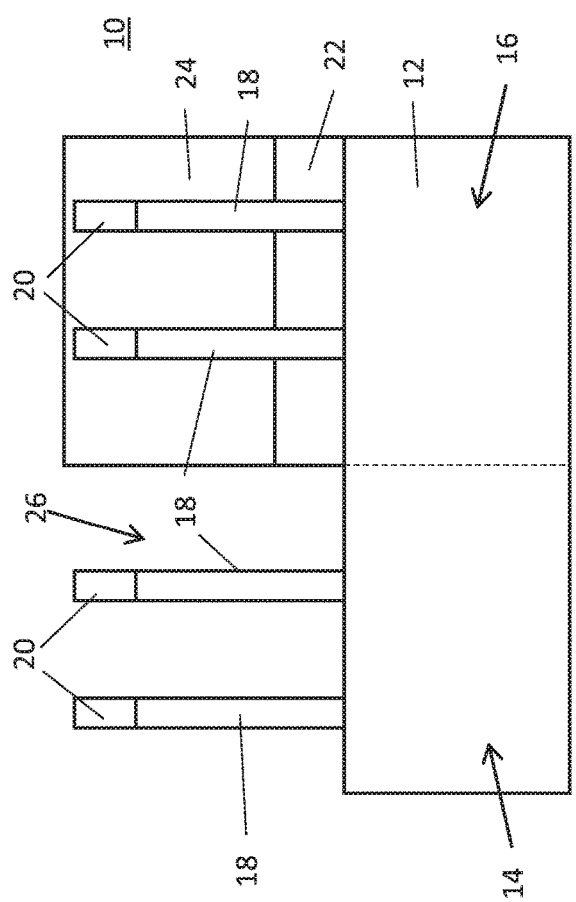
FIG. 3 is a cross-sectional view of the device of FIG. 2 showing etching/patterning of the dielectric layer to expose the first dopant layer in one of the regions and to block one of the regions in accordance with the present principles.

Referring to FIG. 3, a block mask (not shown) or other patterning technique is employed to remove the dielectric layer 24 and the first donor layer 22 from the NFET region 14. The patterning includes blocking the PFET region 16 and selectively etching (e.g., by RIE) the NFET region 14 to remove the dielectric layer 24 and the first donor layer 22 from area 26 to expose the substrate 12 and expose the fins 18 in this area 26. The block mask is then removed.

Figure 4:
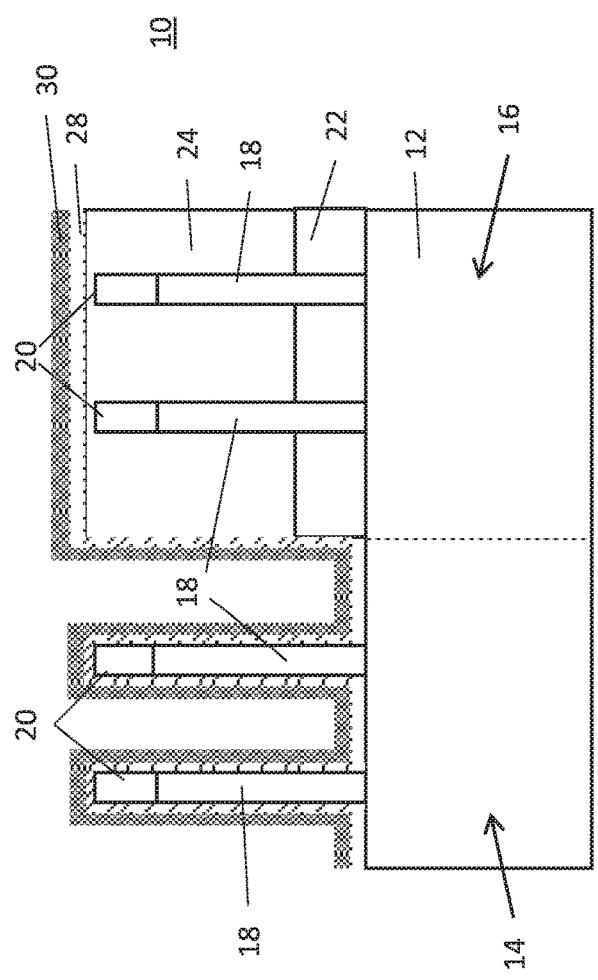
FIG. 4 is a cross-sectional view of the device of FIG. 3 showing a second dopant layer and a cap layer conformally formed over the device in accordance with the present principles.

Referring to FIG. 4, a second dopant layer 28 is conformally deposited over the device 10. The second dopant layer 28 covers exposed lateral portions of the fins 18 and a horizontal surface of the substrate 12. The second dopant layer 28 may include a dopant carrying silicate glass, such as, e.g., borosilicate glass (BSG). BSG provides boron dopants (p-type) for NFET regions 16; however, other silicate glasses or dopant carrying materials may be employed for p-doping. The second dopant layer 28 may be deposited using a CVD process although evaporative and other deposition processes may be employed.

A cap layer 30 is conformally formed over the second dopant layer 28. The cap layer 30 may include a silicon nitride material, although other suitable dielectric materials may be employed. The cap layer 30 may be deposited by CVD or other suitable process. The cap layer 30 covers the second dopant layer 28 and prevents out-diffusion of dopants to later formed materials on the second dopant layer 28. The cap layer 30 assists in reducing initial out-diffusion.

Figure 5:
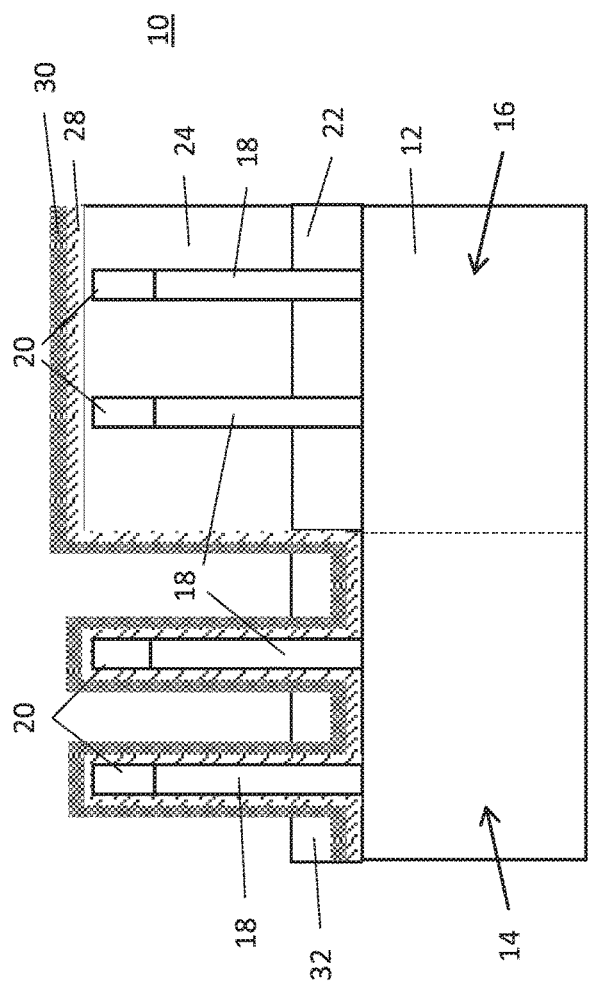
FIG. 5 is a cross-sectional view of the device of FIG. 4 showing an organic dielectric layer recessed on the cap layer between fins in accordance with the present principles.

Referring to FIG. 5, an organic dielectric layer (ODL) 32 or other suitable dielectric material is deposited over the device 10 and recessed by an etch recess process to a height on the fins 18 where a PTS will approximately be formed. Once the height of the PTS is provided, another etch process is performed to remove the cap layer 30 and the second dopant layer 28 down to the height of the ODL 32 (FIG. 6).

Figure 6:
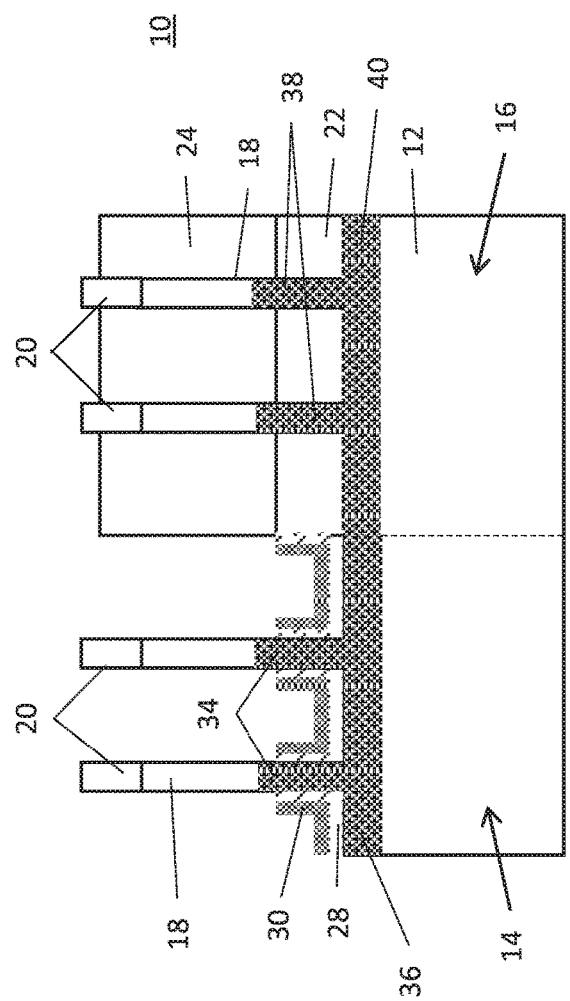
FIG. 6 is a cross-sectional view of the device of FIG. 5 showing the cap layer and the second dopant layer recessed between fins, and the device annealed to concurrently formed punch through stoppers in the fins and well (e.g., surface wells) in the substrate in both regions in accordance with the present principles.

Referring to FIG. 6, a RIE etch pull down process is performed to remove the cap layer 30 and the second dopant layer 28 down to the height of the ODL 32. The second dopant layer 28 is now in contact with the fins 18 and the substrate 12, and the first dopant layer 22 is now in contact with the fins 18 and the substrate 12. The ODL 32 is removed to expose the cap layer 30.

A drive-in anneal process is employed to drive-in dopants from the first dopant layer 22 and the second dopant layer 28. The drive-in anneal process may include a thermal anneal of between about 800 degrees C. to about 1000 degrees C. for between about 30 seconds to about 10 minutes. In one embodiment, the same anneal process concurrently drives in dopants from the first dopant layer 22 in the PFET region 16 and the second dopant layer 28 in the NFET region 14. Dopants from the first dopant layer 22 and the second dopant layer 28 diffuse into adjacent regions of the substrate 12 and fins 18 during the anneal. The diffusion of dopants concurrently forms PTSs 34 and well 36 for the fins 18 in NFET region 14, and PTSs 38 and well 40 for fins 18 in PFET region 16.

Figure 7:
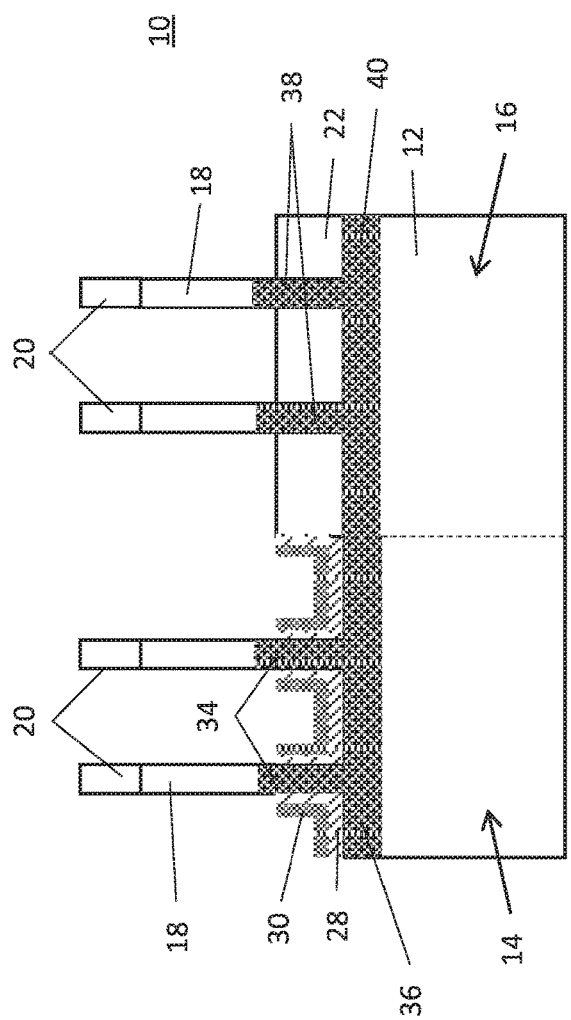
FIG. 7 is a cross-sectional view of the device of FIG. 6 showing the dielectric layer removed to expose the first dopant layer in accordance with the present principles.

Referring to FIG. 7, the dielectric layer 24 is removed to expose the underlying first dopant layer 22. The dielectric layer 24 may be removed using RIE etching or wet etching. The etch is selective and removes the dielectric layer 24 relative to other materials.

Figure 8:
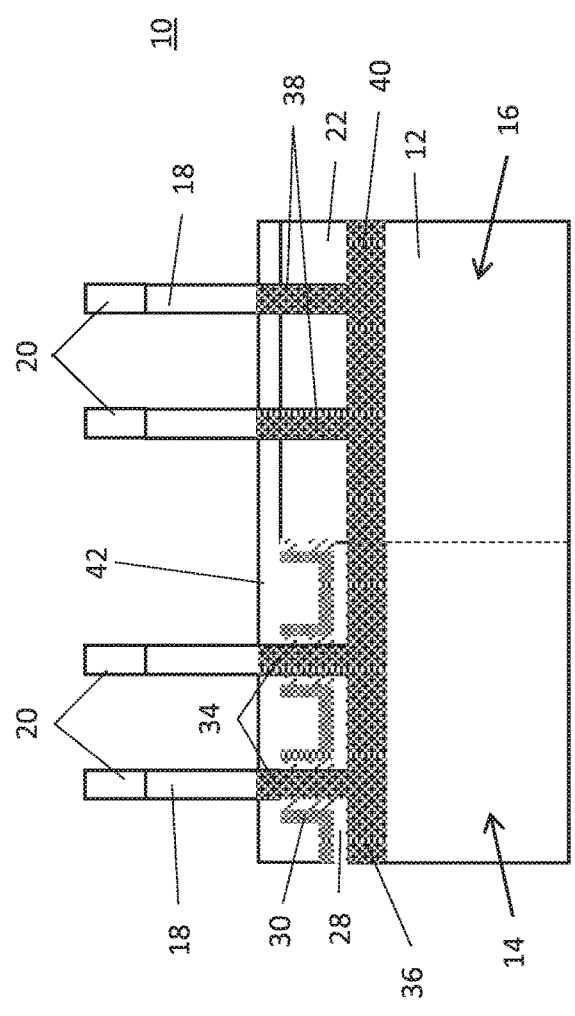
FIG. 8 is a cross-sectional view of the device of FIG. 7 showing a field dielectric (e.g., oxide) formed over the first dopant layer and the cap/second dopant layer in accordance with the present principles.

Referring to FIG. 8, a field dielectric 42, e.g., a field oxide (FOX) is deposited over the device 10. The field dielectric 42 is then recessed to a height above the remaining portions of the first dopant layer 22 and the cap layer 30 (over the second dopant layer 28). The field dielectric 42 is recessed to the height of the PTSs 34 and 38. Processing can continue on the field dielectric 42 by forming gate structures, source and drain regions and metallization layers.

Figure 9:
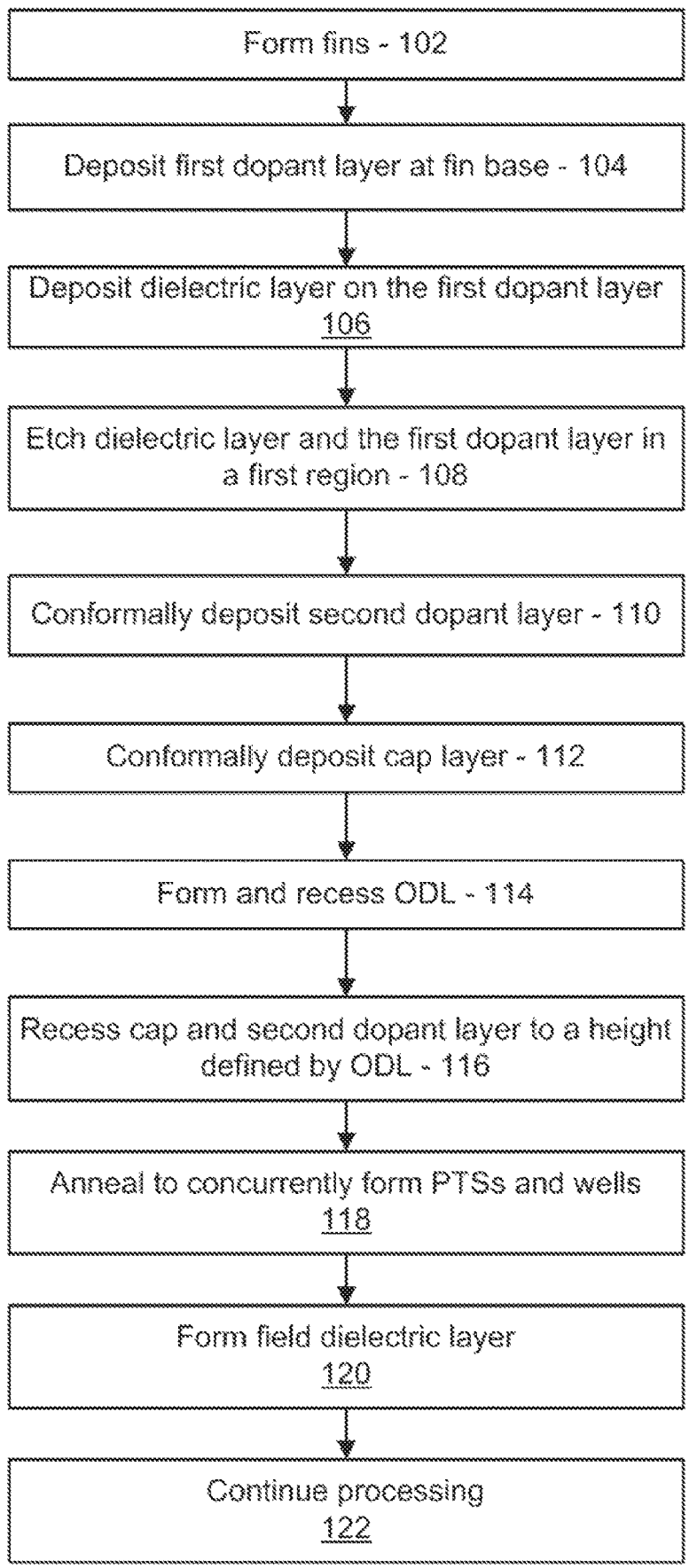
FIG. 9 is a block/flow diagram showing methods for doping fins for fabrication of a finFET device in accordance with illustrative embodiments.

Referring to FIG. 9, methods for doping fins for fabrication of finFET devices are shown in accordance with the preset principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, fins are patterned/etched in a substrate. The fins may be formed or designated with two or more regions (e.g., NFET, PFET, etc.). A hard mask, a lithographic mask or SIT mask may be employed to perform the etching to form fins. The etch process may include RIE. In block 104, a first dopant layer is deposited at a base of the fins. The first dopant layer may include a silicate glass. The type of dopant in the first dopant layer will depend on a type of region to be formed in the substrate. The doped silicate glass may be recessed to a thickness on the fins associated with the punch through stoppers.

In block 106, a dielectric layer is deposited on the first dopant layer. The dielectric layer may include a silicon oxide. In block 108, the dielectric layer and the first dopant layer are etched in a first region (e.g., NFET region) to expose the substrate and the fins.

In block 110, a second dopant layer is conformally deposited over the fins and the substrate in the first region. The second dopant layer may include a doped silicate glass. In block 112, a cap layer may be conformally formed over the second dopant layer. In block 114, an organic dielectric layer is formed and recessed down to a height on the fins in the first region. The organic dielectric layer (ODL) may include, e.g., a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

In block 116, the cap layer and second dopant layer are recessed to the height (e.g., the height of the ODL), which is configured to define dimensions of a punch through stopper after the dopants are diffused into the fin. The height of the dopant material may be lower than the completed PTS to allow for diffusion. In block 118, an anneal process is performed to drive dopants into the fins from the first dopant layer in the first region and from the second dopant layer in the second region to concurrently form punch through stoppers in the fins and wells in the substrate. The first dopant layer and the second dopant layer nay include different dopant conductivity types, and the first region may include an NFET region or a PFET region and the second region may include the other of the NFET region and the PFET region.

In block 120, a field dielectric (e.g., field oxide or FOX) is formed over the first and second dopant layers. The field dielectric is formed from the base of the fins to a top of the punch through stoppers. In block 122, processing continues with the formation of gate structures, source and drain regions, contacts and metallizations, etc. to complete the device(s).

The terminology used herein is for the purpose of describing particular embodiments only and is not intended to be limiting of example embodiments. As used herein, the singular forms "a," and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the Wis. For example, if the device in the FIGS. is turned over elements described as "below or beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments from well and punch through stopper formation using conformal doping (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for doping fins, comprising:
  for a first dopant layer formed in a first region and a second region to a height continuously below a top portion of a plurality of fins such that an entirety of the first dopant layer is formed below the top portion of the plurality of fins, and a dielectric layer formed over the top portion of the plurality of fins:
    removing the dielectric layer and the first dopant layer in the first region to expose a first fin in the first region;
    forming a second dopant layer over the first fin; and
    annealing to drive dopants into the fins from the first dopant layer in the second region and from the second dopant layer in the first region.

2. The method as recited claim 1, wherein the annealing concurrently forms punch through stoppers in the fins.

3. The method as recited in claim 2, further comprising forming the first dopant layer by:
  depositing a doped silicate glass; and
  recessing the doped silicate glass to a thickness on the fins associated with the punch through stoppers.

4. The method as recited in claim 1, further comprising forming the first dopant layer by depositing the first dopant layer over the fins, and recessing the first dopant layer down to the height.

5. The method as recited in claim 1, wherein the first dopant layer is disposed between the dielectric layer and the substrate.

6. The method as recited in claim 1, wherein removing the dielectric layer and the first dopant layer in the first region further includes etching the dielectric layer and the first dopant layer in the first region.

7. The method as recited in claim 1, wherein forming the second dopant layer over the first fin includes conformally depositing the second dopant layer over the first fin.

8. The method as recited in claim 7, wherein forming the second dopant layer in the first region further includes recessing the second dopant layer to the height.

9. The method as recited in claim 8, wherein recessing the second dopant layer includes depositing an organic dielectric layer on the fins.

10. The method as recited in claim 9, further comprising recessing the organic dielectric layer to the height to etch the second dopant layer to the height.

11. The method as recited in claim 9, wherein the organic dielectric layer is spun on.

12. The method as recited in claim 1, wherein forming the second dopant layer includes depositing a doped silicate glass.

13. The method as recited in claim 1, further comprising forming a cap layer over the second dopant layer.

14. The method as recited in claim 13, wherein the cap layer is conformally formed over the second dopant layer.

15. The method as recited in claim 13, further comprising recessing the cap layer and the second dopant layer to the height.

16. The method as recited in claim 1, wherein the first region includes one of an n-type field effect transistor (NFET) region or a p-type field effect transistor (PFET) region and the second region includes the other of the NFET region or the PFET region.

17. The method as recited in claim 1, wherein the first dopant layer and the second dopant layer include different dopant conductivity types.

18. The method as recited in claim 1, further comprising forming a field dielectric over the first and second dopant layers.

19. The method as recited in claim 18, wherein the field dielectric is formed from a base of the fins to a top of punch through stoppers in the fins.

20. The method as recited in claim 1, wherein the annealing includes forming a first well in the first region below the first dopant layer and a second well in the second region below the second dopant layer.

* * * * *